(12) United States Patent
Kanno et al.

(10) Patent No.: US 7,724,531 B2
(45) Date of Patent: May 25, 2010

(54) CONTROL MODULE

(75) Inventors: Kiyotaka Kanno, Hitachinaka (JP); Yasunori Odakura, Mito (JP)

(73) Assignee: Hitachi, Ltd., Tokyo (JP)

( * ) Notice: Subject to any disclaimer, the term of this patent is extended or adjusted under 35 U.S.C. 154(b) by 1028 days.

(21) Appl. No.: 10/578,918

(22) PCT Filed: Nov. 18, 2003

(86) PCT No.: PCT/JP03/14639

§ 371 (c)(1), (2), (4) Date: May 9, 2006

(87) PCT Pub. No.: WO2005/050805

PCT Pub. Date: Jun. 2, 2005

(65) Prior Publication Data

US 2007/0051596 A1     Mar. 8, 2007

(51) Int. Cl.
*H05K 5/00* (2006.01)
(52) U.S. Cl. .................................... 361/752; 361/777
(58) Field of Classification Search .......... 361/760, 361/736, 720, 748, 777, 767; 257/288
See application file for complete search history.

(56) References Cited

U.S. PATENT DOCUMENTS

| | | | |
|---|---|---|---|
| 5,276,418 A | | 1/1994 | Klosowiak et al. |
| 5,443,550 A | * | 8/1995 | Yoneda et al. ........... 73/114.32 |
| 5,895,883 A | | 4/1999 | Bhatti et al. |
| 6,354,846 B1 | * | 3/2002 | Murakami ................ 439/76.2 |
| 6,445,584 B1 | * | 9/2002 | Riehl et al. .................. 361/707 |
| 6,703,703 B2 | * | 3/2004 | Grant ......................... 257/688 |
| 7,207,187 B2 | * | 4/2007 | Funahashi et al. .......... 62/228.4 |
| 2002/0003377 A1 | | 1/2002 | Yuasa et al. |

FOREIGN PATENT DOCUMENTS

| | | |
|---|---|---|
| JP | 8-79936 A | 3/1996 |
| JP | 11-63219 A | 3/1999 |
| JP | 2002-34120 A | 1/2002 |
| JP | 2002-218629 A | 8/2002 |

OTHER PUBLICATIONS

European Search Report dated Dec. 14, 2006 (Three (3) pages).
International Search Report dated Jan. 20, 2004 including English Translation of relevant portion (Three (3) pages).

* cited by examiner

*Primary Examiner*—Hung S Bui
(74) *Attorney, Agent, or Firm*—Crowell & Moring LLP

(57) ABSTRACT

A control module includes a control circuit unit and a wiring unit contained between a cover and a base. The wiring unit has a resin molded part formed by resin-molding nearly central portions of bus bars. The base is shaped to be in contact with the cover when they are fitted to each other, and has protrusions each formed to position between the adjacent bus bars in the flexible region. Contact portions between the cover and the protrusions of the base are fixedly bonded to each other.

5 Claims, 8 Drawing Sheets

CONTROL MODULE

TECHNICAL FIELD

The present invention relates to a control module. More particularly, the present invention relates to a control module in which a control device and a wiring unit for electrically connecting the control device to the exterior are contained in the integral form.

BACKGROUND ART

In one example of known control modules, the control module is disposed in a housing of an automatic transmission in an automobile as disclosed in, e.g., JP-A-11-63219.

DISCLOSURE OF THE INVENTION

In such a known control module, there is a possibility that oil in the automatic transmission may come into the control module through a gap between a cover and a base. The oil contains conductive foreign matters, such as metal powder, generated from gears of the automatic transmission. When bus bars are used as wiring members in the control module, the surfaces of the bus bars have to be covered with insulation coatings, for example, in view of a risk that the adjacent bus bars are short-circuited due to the metal powder in the oil. That necessity leads to a problem of reducing productivity. If the gap in a fitted area between the cover and the base is made smaller, a difficulty occurs in positioning the cover and the base when they are fitted to each other, and efficiency in assembly work is deteriorated.

An object of the present invention is to provide a control module which is improved in productivity and workability.

(1) To achieve the above object, the present invention provides a control module comprising a control circuit unit and a wiring unit connecting terminals of the control circuit unit to connectors, the control circuit unit and the wiring unit being contained between a cover and a base, wherein the wiring unit has a resin molded part formed by resin-molding nearly central portions of bus bars, which are constituted by a plurality of conductors, the resin molded part serving as a rigid region, and a part where the bus bars are exposed serves as a flexible region; the base is shaped to be contacted with the cover when the cover and the base are fitted to each other, and has protrusions each formed to position between the adjacent bus bars in the flexible region; and contact portions between the cover and the protrusions of the base are fixedly bonded to each other.

With that arrangement, productivity and workability are improved.

(2) In above (1), preferably, the control module further comprises a frame arranged to surround an outer periphery of the control circuit unit and shaped to be contacted with the cover and the base when the cover and the base are fitted to each other, wherein one respective ends of the bus bars in the wiring unit are arranged to penetrate through the frame; and contact portions between the cover and the frame, contact portions between the base and the frame, or contact portions between a protrusion provided on the base to penetrate through the frame and the cover are fixedly bonded to each other.

(3) In above (2), preferably, the frame is made of resin; the resin molded part and the frame are integrally molded with resin; and the contact portions between the cover and the frame and the contact portions between the base and the frame are fixedly bonded to each other.

(4) In above (2), preferably, the frame is made of a material having elasticity; and the contact portions between the protrusion provided on the base to penetrate through the frame and the cover are fixedly bonded to each other.

(5) Also, to achieve the above object, the present invention provides a control module comprising a control circuit unit and a wiring unit connecting terminals of the control circuit unit to connectors, the control circuit unit and the wiring unit being contained between a cover and a base, wherein the control module further comprises a frame arranged to surround an outer periphery of the control circuit unit and shaped to be contacted with the cover and the base when the cover and the base are fitted to each other; one respective ends of the bus bars in the wiring unit are arranged to penetrate through the frame; and contact portions between the cover and the frame, contact portions between the base and the frame, or contact portions between a protrusion provided on the base to penetrate through the frame and the cover are fixedly bonded to each other.

With that arrangement, productivity and workability are improved.

BEST MODE FOR CARRYING OUT THE INVENTION

The construction of a control module according to a first embodiment of the present invention will be described below with reference to FIGS. 1-8. The following description is made, by way of example, on an assumption that the control module is assembled in an automatic transmission and controls the automatic transmission.

First, the entire construction of the control module according to this embodiment will be described with reference to FIG. 1.

Figure 1:
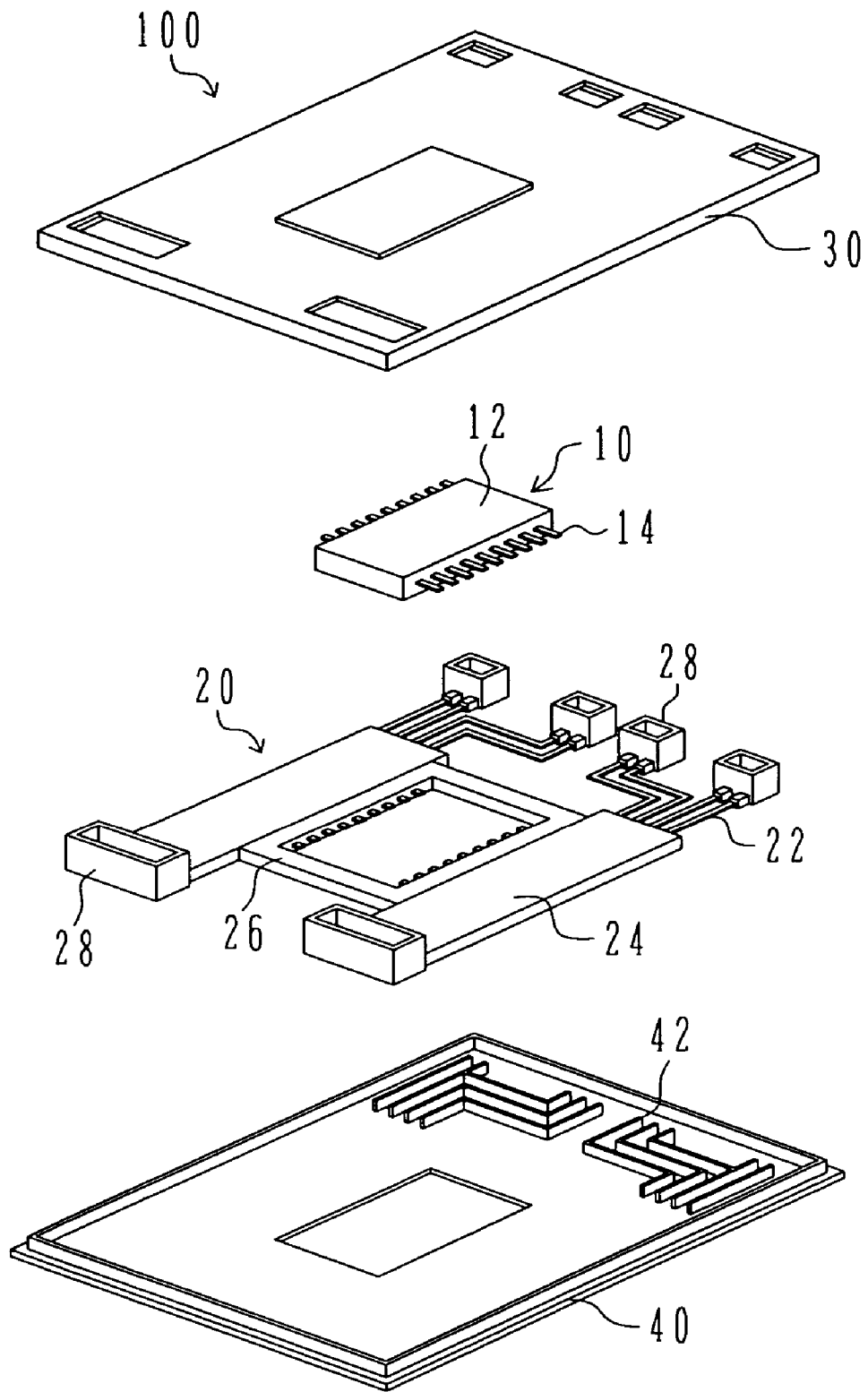
FIG. 1 is an exploded perspective view showing the entire construction of a control module according to a first embodiment of the present invention.

FIG. 1 is an exploded perspective view showing the entire construction of the control module according to the first embodiment of the present invention.

The control module 100 comprises an automatic transmission control unit (ATCU) 10, a wiring unit 20, a cover 30, and a base 40.

The ATCU 10 is a control circuit unit which includes a CPU, a memory such as ROM or RAM, an input/output portion (I/O), etc. and which is molded with resin. A plurality of conductive terminals 14 for inputting and outputting of signals from and to the exterior are projected from both lateral sides of a case 12 of the ATCU 10. Gaps between the case 12 and the conductive terminals 14 are sealed off to provide a structure of preventing oil, etc. from entering the interior.

The wiring unit 20 comprises a plurality of bus bars 22, an insulation molded part 24, a resin-made frame 26, and connectors 28. The bus bars 22 are each a conductive member formed by punching a copper-made thin sheet into a linear strip by a press. The bus bars 22 are insert-molded in their nearly central portions with resin to form the insulation molded part 24. The insulation molded part 24 holds the plurality of bus bars 22 in a mutually separated and insulated relation. The resin-made frame 26 is in the form of a frame having the size larger than the outer dimensions of the ATCU 10. The height of the frame 26 is set such that, when the cover 30 and the base 40 are fitted to each other, the upper and lower surfaces of the frame 26 contained inside both the members contact with the cover 30 and the base 40, respectively. The insulation molded part 24 and the resin-made frame 26 are integrally molded with resin. For example, nylon is used as the resin for molding the insulation molded part 24 and the resin-made frame 26. One respective ends of the plurality of bus bars 22 are projected and exposed in the inner side of the frame 26, i.e., in the side where the ATCU 10 is contained. The one ends of the bus bars 22 are connected to the conductive terminals of the ATCU 10. The connectors 28, etc. are connected to the other respective ends of the plurality of bus bars 22 in advance. With such an arrangement that the plurality of bus bars 22 are integrally molded by the insulation molded part 24 while they are held in a state separated from each other at a predetermined interval, and the connectors 28 are connected to the other respective ends of the plurality of bus bars 22, the wiring unit 20 shown in FIG. 1 can be easily handled and the wiring work can be easily completed just by placing the wiring unit 20 on the base 40 in a predetermined position.

More specifically, the base 40 has a plurality of protrusions 42 formed on it. The wiring work just requires the plurality of bus bars 22 in the wiring unit 20 to be each disposed between the adjacent protrusions 42. The base 40 and the cover 30 are dimensioned such that they can be fitted to each other. Also, the base 40 and the cover 30 are each molded with resin, e.g., nylon. The height of the protrusions 42 is set such that, when the base 40 and the cover 30 are fitted to each other, the upper surfaces of the protrusions 42 contact with the lower surface of the cover 30.

In assembly of the control module 100 of this first embodiment, the plurality of bus bars 22 in the wiring unit 20 are each disposed between adjacent two of the plurality of protrusions 42 on the base 40. Then, the ATCU 10 is placed inside the frame 26 of the wiring unit 20. One respective ends of the plurality of bus bars 22 are connected to the conductive terminals 14 of the ATCU 10 by, e.g., welding. Further, the cover 30 is put on a sub-assembly thus obtained, and the cover 30 and the base 40 are fitted to each other. In addition, the upper surfaces of the protrusions 42 on the base 40 and the lower surface of the cover 30 are fixedly bonded to each other in contact portions between them by fusion bonding. Similarly, the upper and lower surfaces of the frame 26 are fixedly bonded to the cover 30 and the base 40, respectively, in contact portions between them.

The arrangement of the control module of this first embodiment will be described below with reference to FIG. 2.

Figure 2:
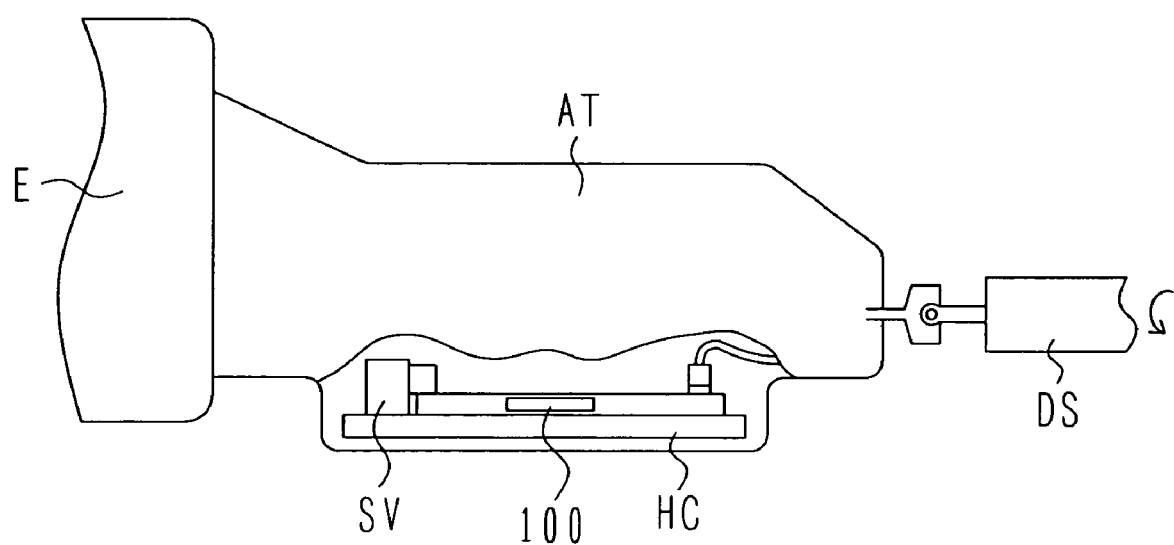
FIG. 2 is a front view, partly sectioned, showing the construction of a part of a vehicle in which the control module according to the first embodiment of the present invention is arranged.

FIG. 2 is a front view, partly sectioned, showing the construction of a part of a vehicle in which the control module according to the first embodiment of the present invention is arranged.

A transmission AT is connected between an engine E and a drive shaft DS. A hydraulic controller HC is disposed inside a housing of the transmission AT at the bottom of the housing. The hydraulic controller HC controls the hydraulic pressure supplied to an actuator for controlling, e.g., the changing-over operation of a clutch that is disposed inside the transmission AT. A solenoid valve SV and the control module 100 are fixedly arranged on the hydraulic controller HC. A connector of the solenoid valve SV and the connectors of the control module 100 are directly connected to each other for electrical conduction therebetween. The control module 100 performs on/off-control of the solenoid valve SV to allow or stop supply of oil from the hydraulic controller HC to the actuator, thereby driving the actuator.

Figure 4:
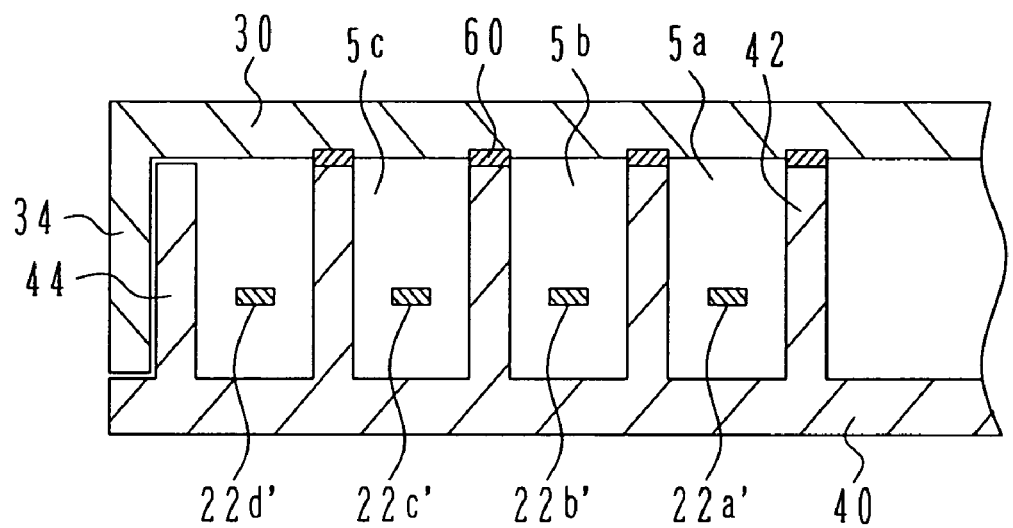
FIG. 4 is a sectional view taken along the line I-I in FIG. 3.
Figure 5:
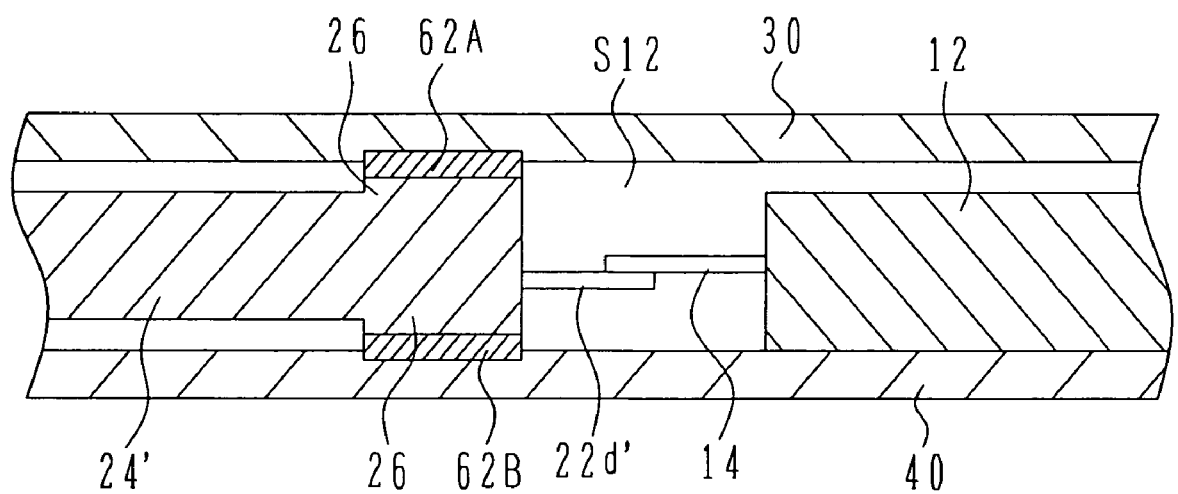
FIG. 5 is a sectional view taken along the line II-II in FIG. 3.

The detailed construction of the control module of this first embodiment will be described below with reference to FIGS. 3-5.

Figure 3:
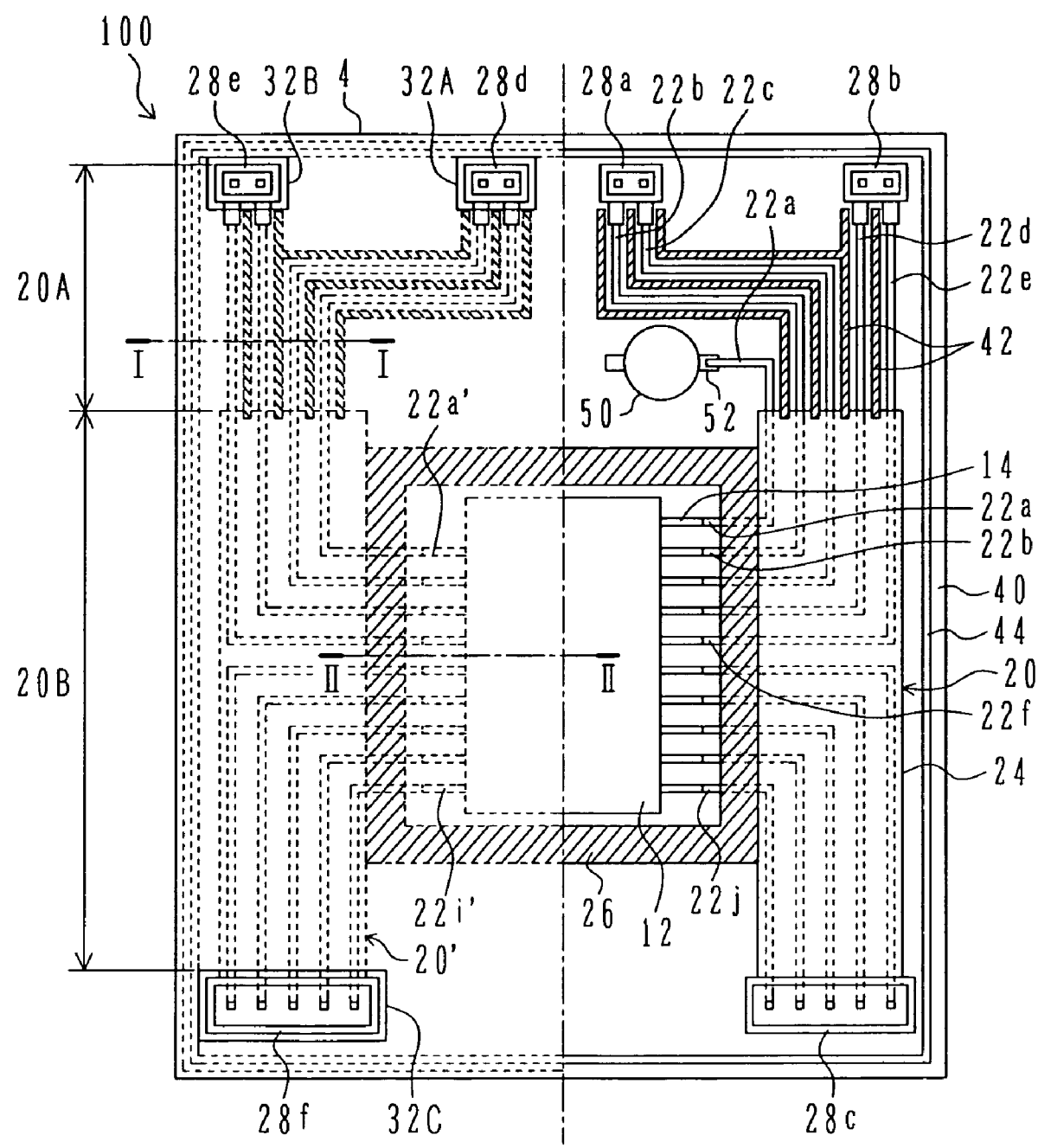
FIG. 3 is a structural view showing the detailed construction of the control module according to the first embodiment of the present invention.

FIG. 3 is a structural view showing the detailed construction of the control module according to the first embodiment of the present invention. A right half of FIG. 3 shows a sectioned state. FIG. 4 is a sectional view taken along the line I-I in FIG. 3. FIG. 5 is a sectional view taken along the line II-II in FIG. 3. Note that, in each of those drawings, the same symbols as those in FIG. 1 denote the same components.

As shown in FIG. 3, bus bars $22a, \ldots, 22j, 22a', \ldots, 22i'$ are each formed, for example, by punching a copper-made thin sheet with a thickness of 0.5 mm into a linear strip with a width of 1 mm by a press. The bus bars $22a, \ldots, 22j$ are insert-molded in their nearly central portions with resin to form one insulation molded part 24. Likewise, the bus bars $22a', \ldots, 22i'$ are insert-molded in their nearly central portions with resin to form the other insulation molded part 24'. Further, the resin-made frame 26 having a rectangular shape is resin-molded integrally with the insulation molded parts 24 and 24'. As shown in the drawing, the resin-made frame 26 is dimensioned to be able to contain the ATCU 10 in its inner space. One respective ends of the plurality of bus bars $22a, \ldots, 22j$ are projected and exposed in the inner side of the frame 26, i.e., in the side where the ATCU 10 is contained, along a first side of the frame 26. Also, one respective ends of the plurality of bus bars $22a', \ldots, 22i'$ are projected and exposed in the inner side of the frame 26, i.e., in the side where the ATCU 10 is contained, along a second side (side opposite to the first side) of the frame 26. The one respective ends of the plurality of bus bars $22a, \ldots, 22j$ and the one respective ends of the plurality of bus bars $22a', \ldots, 22i'$ are connected to the plurality of conductive terminals 14 of the ATCU 10 that is contained inside the frame 26.

The other respective ends of the bus bars $22b, 22c, 22d$ and $22e$ adjacent to each other are held in such a state that they are separated from each other at a predetermined interval (e.g., a pitch of 3 mm) and are mutually insulated. A connector 28*a* is connected to the other ends of the bus bars 22*b* and 22*c* in advance. Also, a connector 28*b* is connected to the other ends of the bus bars 22*d* and 22*e* in advance. Further, a connector 28*c* is connected to the other ends of the bus bars 22*f*, . . . , 22*j* in advance. Similarly, connectors 28*d*, 28*e* and 28*f* are connected to the other ends of the plurality of bus bars 22*a'*, . . . , 22*i'* in advance.

Thus, as shown in FIG. 1, with the above-described arrangement that the wiring unit 20 comprises the plurality of bus bars 22, the insulation molded part 24, the resin-made frame 26, and the connectors 28, that the plurality of bus bars 22 are integrally molded by the insulation molded part 24 while they are held in the state separated from each other at the predetermined interval, and that the connectors 28 are connected to the other respective ends of the bus bars 22, it is possible to easily handle the wiring unit 20 and to easily complete the wiring work just by placing the wiring unit 20 on the base 40 in a predetermined position.

Further, a pressure switch 50, i.e., a component to be controlled, is mounted to the base 40 at a predetermined position. After placing the wiring unit 20 on the base 40, the bus bar 22*a* is connected to a terminal connecting portion 52 of the pressure switch 50 by, e.g., welding. Instead of output means such as the pressure switch 50, input means such as a sensor can be connected to the other end of the bus bar 20.

A wiring unit 20' is divided into a flexible region 20A and a rigid region 20B. The rigid region 20B is a region where the plurality of bus bars 22*a'*, . . . , 22*i'* are insert-molded with resin to form the insulation molded part 24' and has higher rigidity than the flexible region 20A. The flexible region 20A is a region constituted only by the other ends of the plurality of bus bars 22*a'*, . . . , 22*i'* without being molded with resin. Since the flexible region 20A is constituted only by the bus bars 22*a'*, . . . , 22*i'* made of the thin sheets unlike the rigid region 20B, it has lower rigidity than the rigid region 20B. Further, the connectors 28*d* and 28*e* are mounted to the other ends of the bus bars 22*a'*, . . . , 22*i'*. Accordingly, when a force is applied to portions between the connectors 28*d*, 28*e* and the rigid region 20B, the bus bars 22*a'*, . . . , 22*i'* in the flexible region 20A are easily deformed such that the length of the flexible region 20A, i.e., the distance between the connectors 28*d*, 28*e* and the rigid region 20B, can be changed to some extent. Similarly to the wiring unit 20', the wiring unit 20 can also be divided into the flexible region 20A and the rigid region 20B.

After mounting the wiring unit 20 onto the base 40, the frame 26 and the base 40 are fixed to each other by fusion bonding as described later. Accordingly, the frame 26 and the insulation molded parts 24' of the wiring unit 20 are fixed to the base 40. On the other hand, the connectors 28*d* and 28*e* are slightly movable in their positions because they are connected through the flexible region 20A. In the state of the cover 30 being mounted to the base 40, as shown in the left side of FIG. 3, the connectors 28*d* and 28*e* are exposed through openings 32A and 32B of the cover 30, respectively. As shown in FIG. 2, the solenoid valve SV and the control module 100 are fixedly mounted on the hydraulic controller HC. The connector of the solenoid valve SV and the connectors (e.g., the connectors 28*d* and 28*e* shown in FIG. 3) of the control module 100 are directly connected to each other for electrical conduction therebetween. At that time, because the solenoid valve SV and the control module 100 being positioned and fixed onto the hydraulic controller HC, if there is a positional deviation between the connector of the solenoid valve SV and the connectors of the control module 100, the flexible region 20A of the wiring unit 20 is deformed to easily absorb the positional deviation between them. Thus, the operation of connecting those connectors can be facilitated.

The connector 28*f* of the wiring unit 20' is used for electrical connection to an external engine control unit (ECU) through, e.g., a wire harness. In the state of the cover 30 being mounted to the base 40, the connector 28*f* is exposed through an opening 32C of the cover 30. Since the wire harness has flexibility, the connector 28*f* can be easily connected to a connector of the wire harness in spite of the connector 28*f* being mounted to the rigid region 20B.

Similarly to the connectors 28*d* and 28*e*, the connectors 28*a* and 28*b* are connected to the other ends of the bus bars 22 in the flexible region. Components fixedly mounted to the hydraulic controller HC, such as the solenoid valve SV, can also be easily electrically connected to the connectors 28*a* and 28*b*. Similarly to the connector 28*f*, the connector 28*c* is connected to a connector of a wire harness.

The plurality of protrusions 42 are formed on an upper surface (i.e., a surface on which the wiring unit 20 and the ATCU 10 are disposed) of the base 40. The adjacent protrusions 42 are spaced at a predetermined interval (e.g., a pitch of 3 mm being the same as the pitch between the adjacent bus bars 22). The wiring work can be completed just by arranging each of the plurality of bus bars 22 in the wiring unit 20 between the adjacent the protrusions 42.

The fusion-bonded structure between the protrusions 42 of the base 40 and the cover 30 will be described below with reference to FIG. 4.

The height of the protrusions 42 is set such that, when the base 40 and the cover 30 are fitted to each other, the upper surfaces of the protrusions 42 contact with the lower surface of the cover 30. The base 40 and the cover 30 are each molded with resin, e.g., nylon. When the melting point of nylon is 260°, for example, contact portions between the upper surfaces of the protrusions 42 and the lower surface of the cover 30 are heated in contact areas 60 to, e.g., 300° C. The protrusions 42 and the cover 30 are melted in the contact portions by the heating. When the heating is stopped and the temperature is returned to room temperature, the melted portions are joined to each other by fusion bonding. A method of heating the contact portions between the upper surfaces of the protrusions 42 and the lower surface of the cover 30 for the fusion bonding can be performed, for example, by a laser or a heater adapted for heating to realize the fusion bonding. Ultrasonic fusion can also be used instead of the fusion by heating.

By thus forming the fusion-bonded structure in the contact portions between the protrusions 42 of the base 40 and the cover 30, the bus bars 22*a'*, 22*b'*, 22*c'* and 22*d'* are held in such a state that they are separated from each other by the protrusions 42 and are contained in spaces 5*a*, 5*b* and 5*c* partitioned by the protrusions 42.

A projected rim 44 is formed along an entire outer periphery of the upper surface of the base 40. Also, a projected rim 34 is formed along an entire outer periphery of the lower surface of the cover 30. Inner dimensions of the projected rim 34 are slightly larger than outer dimensions of the projected rim 44, thus allowing both the projected rims to be fitted to each other. After placing the cover 30 on the base 40, therefore, they can be fitted to each other at the projected rim 34 and the projected rim 44. That fitted area between the cover 30 on the base 40 is formed along an entire outer periphery of the control module 100.

A small gap is left between the projected rim 34 and the projected rim 44. Therefore, when the control module 100 is placed in the transmission oil of the automatic transmission AT as shown in FIG. 2, a certain amount of the transmission oil enters the interior of the control module 100 through the gap between both the projected rims. As described above, however, the bus bars 22a', 22b', 22c' and 22d' are contained in the spaces 5a, 5b and 5c partitioned by the protrusions 42. Accordingly, for example, even when metal powder comes into contact with the bus bar 22d', the metal powder is prevented from contacting with the bus bar 22c' as well. It is generally known that the adjacent bus bars are short-circuited when conductive materials, e.g., metal powder contained in the transmission oil, are deposited to such an extent as causing electrical conduction between the adjacent bus bars. By holding the bus bars in the state separated by the protrusions 42 as in this embodiment, the short-circuiting between the adjacent bus bars can be prevented.

Hitherto, it has been required to perform additional work of pouring a sealant to fill the gap between a base member and a cover member, or of treating the bus bars to become insulated from each other. In contrast, this embodiment can eliminate the necessity of such additional work and can increase productivity and dust resistance.

In the contact portions between the protrusions 42 of the base 40 and the cover 30, they may be continuously fusion-bonded to each other over the entire contact area or partially fusion-bonded at a predetermined interval. For example, even when the contact portions between the protrusions 42 and the cover 30 are partially fusion-bonded, they can be maintained in a closely contacted state so as to prevent the intrusion of metal powder. However, when the intrusion of metal powder cannot be sufficiently prevented with the partial fusion bonding, the fusion bonding has to be continuously performed.

The fusion-bonded structure between the frame 26 of the wiring unit 20 and each of the upper surface of the base 40 and the lower cover of the cover 30 will be described below with reference to FIG. 5.

The height of the frame 26 is set such that, when the cover 30 and the base 40 are fitted to each other, the upper and lower surfaces of the frame 26 contained inside both the members contact with the cover 30 and the base 40, respectively. The base 40, the cover 30 and the frame 26 are each molded with resin, e.g., nylon. Contact portions between the upper surface of the frame 26 and the lower surface of the cover 30 are fusion-bonded to each other in a contact area 62A, and contact portions between the lower surface of the frame 26 and the upper surface of the base 40 are fusion-bonded to each other in a contact area 62B. The fusion bonding can be performed by any suitable one of the above-described methods.

With the structure obtained by fusion-bonding the frame 26 of the wiring unit 20 to the upper surface of the base 40 and the lower cover of the cover 30, a space S12 in which the ATCU 10 is contained is formed as an enclosed space. In other words, the ATCU 10 is contained in that enclosed space. Accordingly, even when the transmission oil enters through the gap in the fitted area between the base 40 and the cover 30, it is possible to avoid conductive materials, e.g., metal powder contained in the transmission oil, from being deposited on the terminals 14 of the ATCU 10, and to prevent the adjacent terminals 14 from being short-circuited.

Thus, while it has hitherto been required to perform additional work of treating the terminals of the ATCU to become insulated from each other, this embodiment can eliminate the necessity of such additional work and can increase productivity and dust resistance.

In the contact portions between the frame 26 and the base 40 or the cover 30, they may be continuously fusion-bonded to each other over the entire contact area or partially fusion-bonded at a predetermined interval.

Additionally, the method for realizing the fixedly bonded structure in the contact portions between the protrusions 42 of the base 40 and the cover 30 and in the contact portions between the frame 26 of the wiring unit 20 and each of the upper surface of the base 40 and the lower surface of the cover 30 is not limited to the fusion bonding, and those contact portions may be fixedly bonded by an adhesive.

Figure 7:
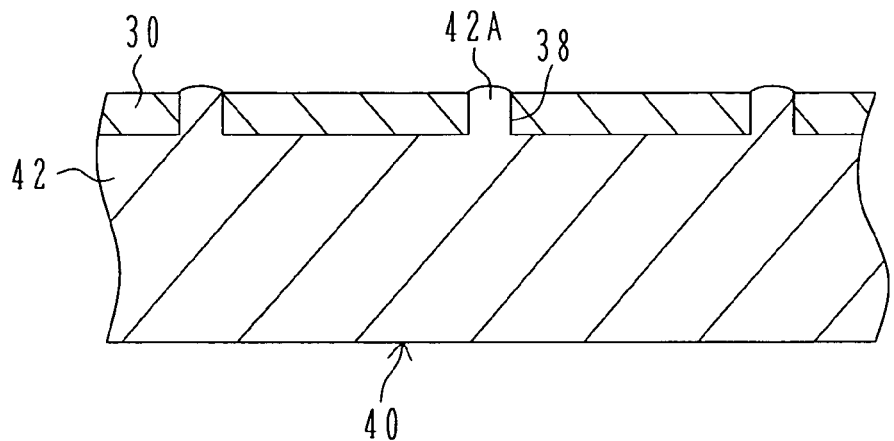
FIG. 7 is a structural view showing a second modification of the fixedly bonded structure in the contact portions between the protrusions of the base and the cover in the control module according to the first embodiment of the present invention.
Figure 8:
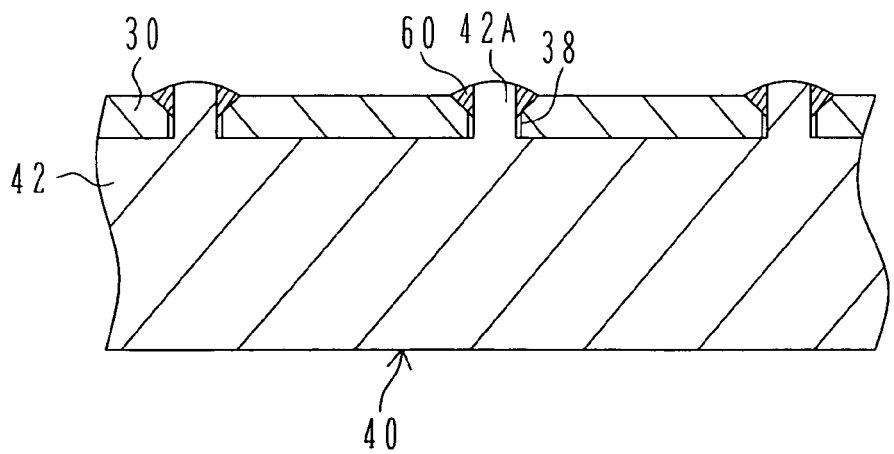
FIG. 8 is a structural view showing a third modification of the fixedly bonded structure in the contact portions between the protrusions of the base and the cover in the control module according to the first embodiment of the present invention.

Modifications of the fixedly bonded structure in the contact portions between the protrusions 42 of the base 40 and the cover 30 will be described below with reference to FIGS. 6-8.

Figure 6:
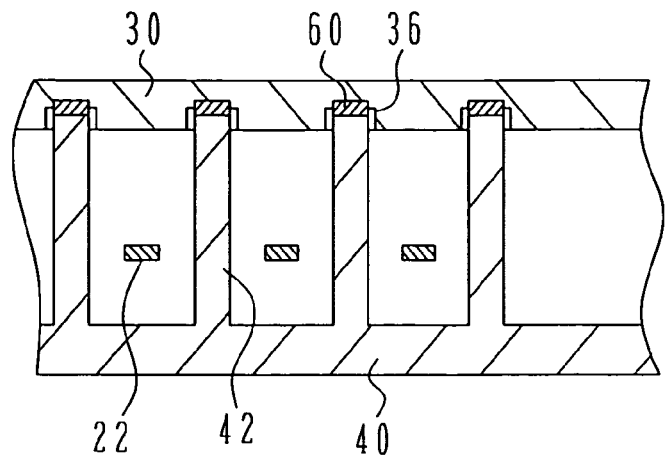
FIG. 6 is a structural view showing a first modification of a fixedly bonded structure in contact portions between protrusions of a base and a cover in the control module according to the first embodiment of the present invention.

FIG. 6 is a structural view showing a first modification of the fixedly bonded structure in the contact portions between the protrusions of the base and the cover in the control module according to the first embodiment of the present invention. FIG. 6 corresponds to a sectional view taken along the line I-I in FIG. 3. FIG. 7 is a structural view showing a second modification of the fixedly bonded structure in the contact portions between the protrusions of the base and the cover in the control module according to the first embodiment of the present invention. FIG. 7 corresponds to a sectional view taken along the line I-I in FIG. 3. FIG. 8 is a structural view showing a third modification of the fixedly bonded structure in the contact portions between the protrusions of the base and the cover in the control module according to the first embodiment of the present invention. FIG. 8 also corresponds to a sectional view taken along the line I-I in FIG. 3. Note that, in each of those drawings, the same symbols as those in FIGS. 3-5 denote the same components.

The first modification of the fixedly bonded structure in the contact portions between protrusions 42 of the base 40 and the cover 30 in the control module according to the first embodiment will be first described with reference to FIG. 6.

In the first modification, the protrusions 42 of the base 40 are engaged in recesses 36 formed in the cover 30. In that engaged state, the lower surface of the cover 30 and the upper surfaces of the protrusions 42 are continuously joined to each other by fusion bonding.

Next, the second modification of the fixedly bonded structure in the contact portions between the protrusions 42 of the base 40 and the cover 30 in the control module according to the first embodiment of the present invention will be described below with reference to FIG. 7.

Further, the third modification of the fixedly bonded structure in the contact portions between the protrusions 42 of the base 40 and the cover 30 in the control module according to the first embodiment will be described below with reference to FIG. 8.

In those embodiments, circular or polygonal projections 42A formed on the upper surface of the protrusions 42A on the base 40 are engaged in holes 38 formed in the cover 30. Then, the projections 42A projected from the protrusions 42 on the base 40 are joined to the cover 30 in the holes 38 thereof by fusion bonding.

As described above, since the protrusions 42 are provided on the base 40 and the contact portions between the protrusions 42 and the cover 30 are fixedly bonded to each other, the short-circuiting between the adjacent bus bars 22 can be easily prevented, thus resulting in improvement of productivity and workability. Also, since the frame 26 is provided on the wiring unit 20 and the contact portions between the frame 26 and each of the upper surface of the base 40 and the lower surface of the cover 30 are fixedly bonded to each other, the short-circuiting between the adjacent terminals 14 of the ATCU 10 can be easily prevented, thus resulting in further improvement of productivity and workability.

The construction of a control module according to a second embodiment of the present invention will be described below with reference to FIGS. 9 and 10.

The overall construction of the control module according to this second embodiment is similar to that shown in FIG. 1. As described later, however, the resin-made frame 26 shown in FIG. 1 is not used, and a frame 26A made of an elastic material, e.g., rubber, is used instead. Also, the control module according to this second embodiment is arranged similarly to the example shown in FIG. 2. Namely, it is arranged inside the automatic transmission AT.

Figure 9:
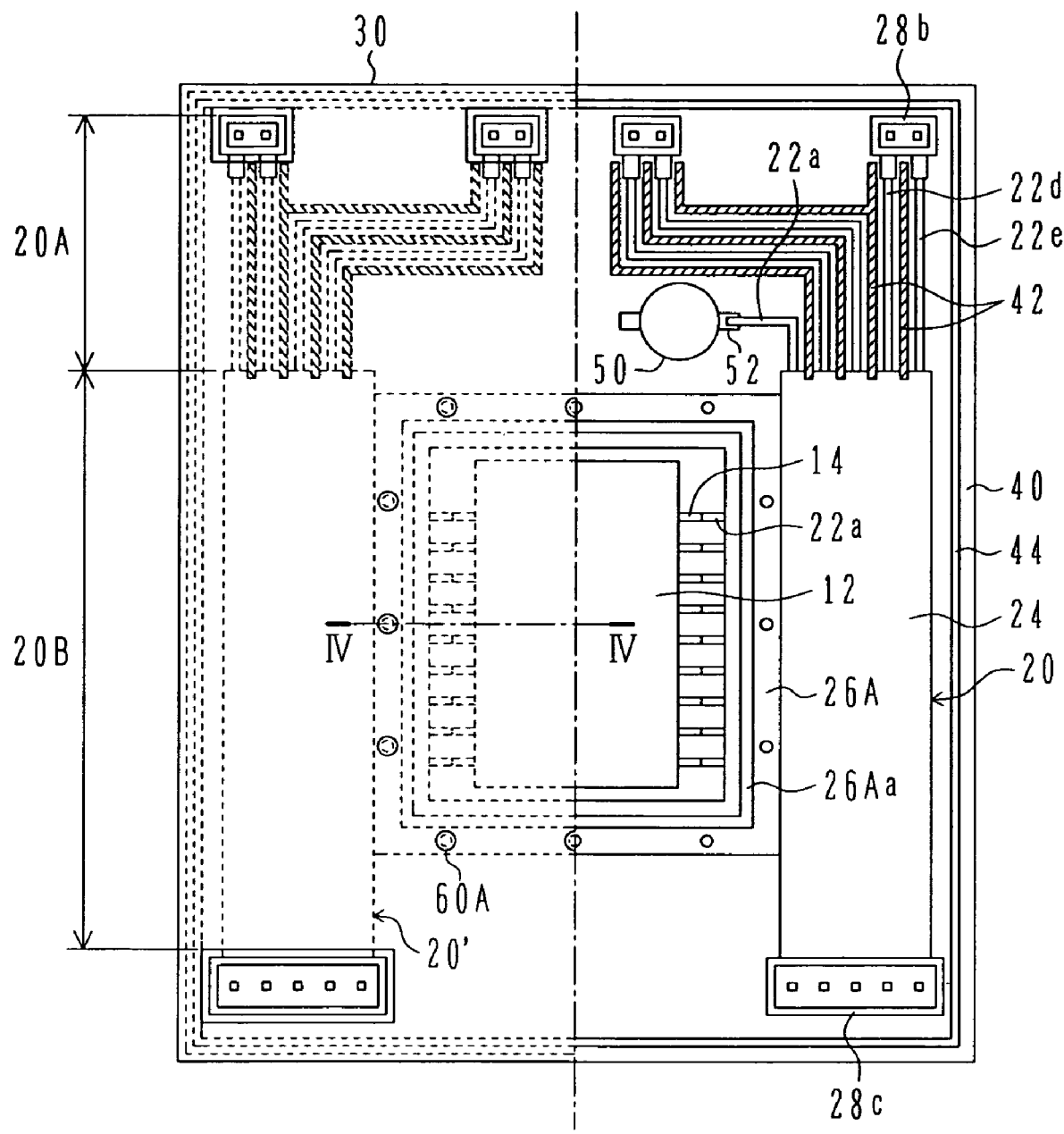
FIG. 9 is a structural view showing the detailed construction of a control module according to a second embodiment of the present invention.

FIG. 9 is a structural view showing the detailed construction of the control module according to the second embodiment of the present invention. A right half of FIG. 9 shows a sectioned state. FIG. 10 is a sectional view taken along the line IV-IV in FIG. 9. Note that, in each of those drawings, the same symbols as those in FIGS. 3-5 denote the same components.

In the first embodiment described above with reference to FIGS. 1 and 3, the insulation molded parts 24, 24' and the resin-made frame 26 are integrally molded with resin. On the other hand, this second embodiment shown in FIG. 9 employs the frame 26A made of an elastic material, e.g., rubber. Therefore, the control module is made up of two components, i.e., a first component constituted by connecting the connectors 28 to the other ends of the plurality of bus bars 22 molded by the insulation molded part 24, and a second component constituted by connecting the connectors 28 to the other ends of the plurality of bus bars 22 molded by the insulation molded part 24'. The frame 26A may be integrally formed with the resin molded part 24 of the wiring unit 20.

As shown in FIG. 9, similarly to the frame 26 shown in FIG. 3, the frame 26A made of an elastic material is a frame having dimensions larger than outer dimensions of the ATCU 10. A rectangular projection 26Aa is integrally formed on the upper surface of the frame 26A. Also, a rectangular projection having the same shape as the projection 26Aa is integrally formed on the lower surface of the frame 26A. In lateral sides of the frame 26A, holes are formed through which the one respective ends of the bus bars 22 in the wiring unit 20 can be inserted. The dimensions of each of the holes are substantially the same as the outer dimensions of each of the bus bars 22. The one respective ends of the bus bars 22 are inserted through the holes of the frame 26A from the outer peripheral side of the frame 26A and are projected to the inner peripheral side of the frame 26A.

Figure 10:
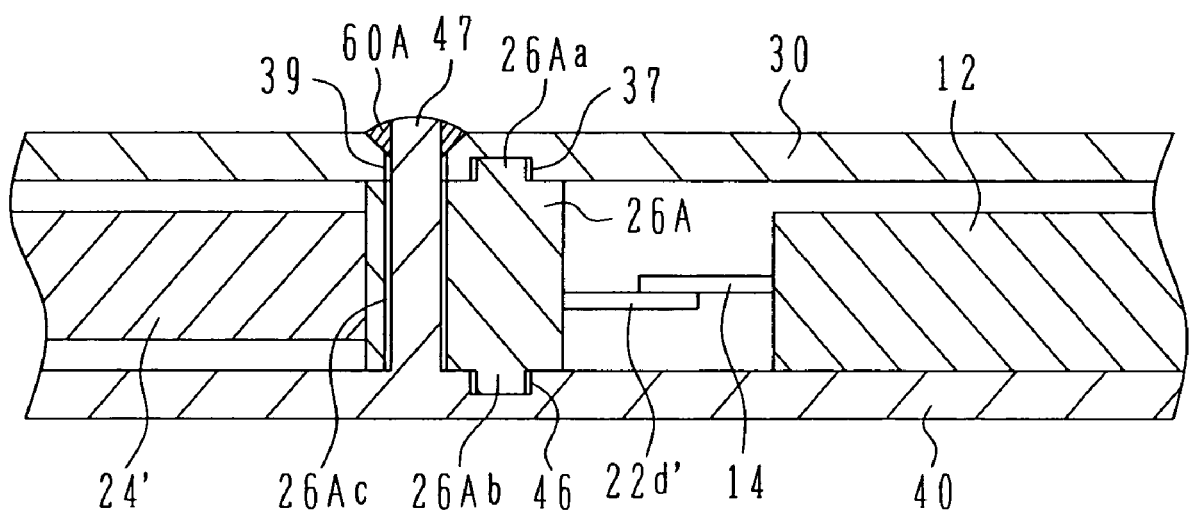
FIG. 10 is a sectional view taken along the line IV-IV in FIG. 9.

As shown in FIG. 10, the projection 26Aa is integrally formed on the upper surface of the frame 26A. Also, the projection 26Ab having the same shape as the projection 26Aa is integrally formed on the lower surface of the frame 26A. On the other hand, a recess 37 is formed in the cover 30 at a position corresponding to the projection 26Aa of the frame 26A. Since the projection 26Aa of the frame 26A is rectangular, the recess 37 is also formed in a rectangular shape.

Further, a plurality of holes 26Ac are formed in the frame 26A to penetrate in the vertical direction. On the other hand, a plurality of circular or polygonal protrusions 47 are formed in the base 40 to be fitted through the holes 26Ac, respectively. In addition, the cover 30 has holes 39 formed therein to allow insertion of the protrusions 47 of the base 40.

The frame 26A is properly positioned by fitting the projection 26Ab of the frame 26A into the recess 46 of the base 40 and by inserting the protrusion 47 of the base 40 through the hole 27Ac of the frame 26A. Also, the protrusion 47 of the base 40 is inserted through the hole 39 of the cover 30, and the recess 37 of the cover 30 is fitted to the projection 26Aa of the frame 26A. Furthermore, in a state where a compressive force is applied to act on the cover 30 and the base 40 so as to compress the frame 26A, contact portions between the protrusion 47 of the base 40 and the hole 39 of the cover 30 are fusion-bonded to each other in a contact area 60A.

Thus, with the above-described structure that the protrusion 47 of the base 40 is fusion-bonded to the hole 39 of the cover 30 and the frame 26A having elasticity is disposed between the cover 30 and the base 40 so as to surround the ATCU 10, the base 40, the frame 26A, and the cover 30 are held in a closely contacted state, and the ATCU 10 is contained in an enclosed space. Accordingly, even when the transmission oil enters through the gap in the fitted area between the base 40 and the cover 30, it is possible to avoid conductive materials, e.g., metal powder contained in the transmission oil, from being deposited on the terminals 14 of the ATCU 10, and to prevent the adjacent terminals 14 from being short-circuited.

As described above, since the protrusions 42 and 47 are provided on the base 40 and the contact portions between the protrusions 42, 47 and the cover 30 are fixedly bonded to each other, the short-circuiting between the adjacent bus bars 22 and the short-circuiting between the adjacent terminals 14 of the ATCU 10 can be easily prevented, thus resulting in improvement of productivity and workability.

The construction of a control module according to a third embodiment of the present invention will be described below with reference to FIG. 11.

The overall construction of the control module according to this third embodiment is similar to that shown in FIG. 1. As described later, however, the resin-made frame 26 shown in FIG. 1 is not used, and a partial frame 26B made of resin and a partial frame 26C made of an elastic material, e.g., rubber, are used instead. Also, the control module according to this third embodiment is arranged similarly to the example shown in FIG. 2. Namely, it is arranged inside the automatic transmission AT.

Figure 11:
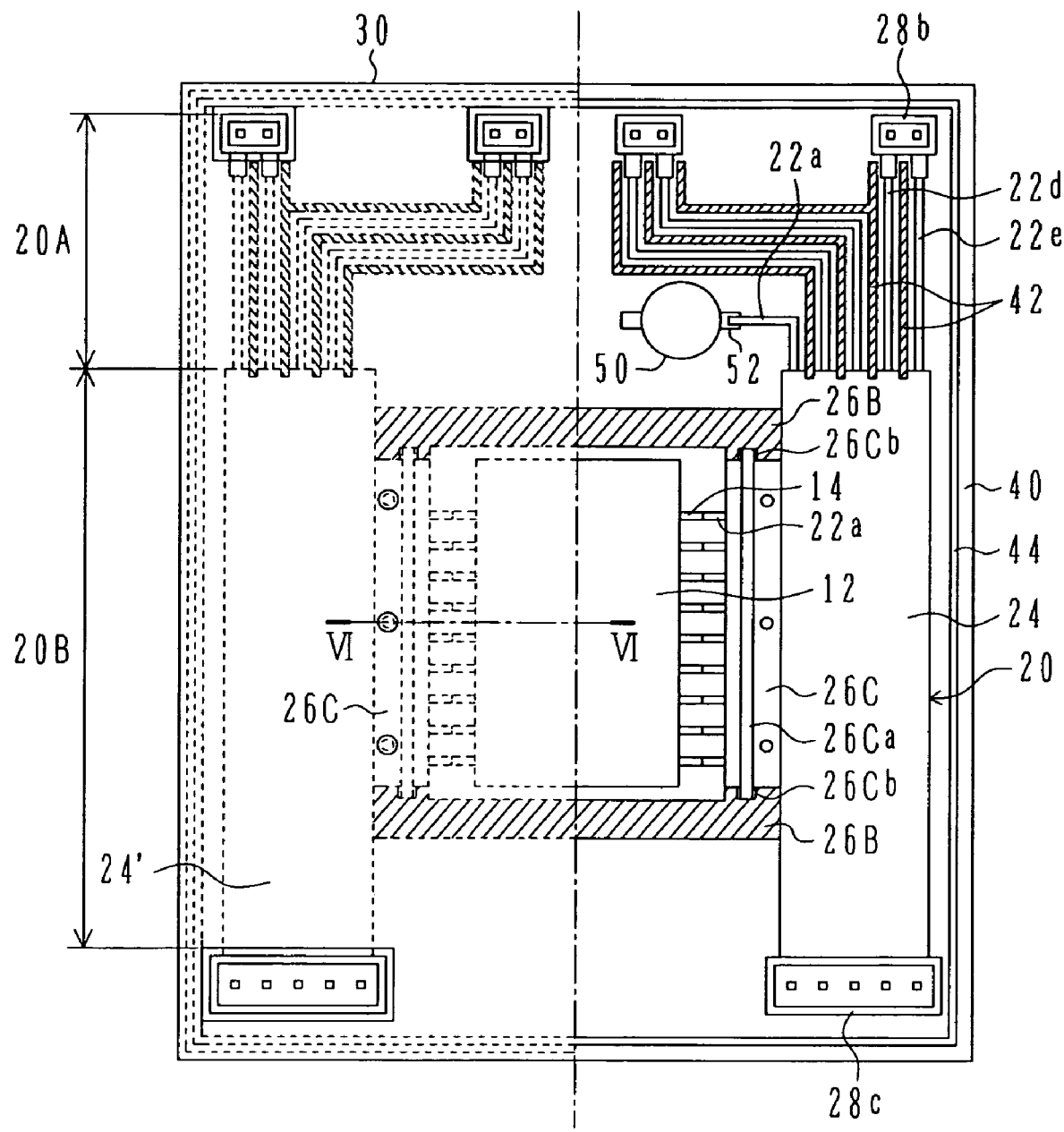
FIG. 11 is a structural view showing the detailed construction of a control module according to a third embodiment of the present invention.

FIG. 11 is a structural view showing the detailed construction of the control module according to the third embodiment of the present invention. A right half of FIG. 11 shows a sectioned state. Note that, in FIG. 11, the same symbols as those in FIGS. 3-5, 9 and 10 denote the same components.

In the first embodiment described above with reference to FIGS. 1 and 3, the insulation molded parts 24, 24' and the rectangular resin-made frame 26 are integrally molded with resin. On the other hand, in this third embodiment shown in FIG. 11, the insulation molded parts 24, 24' and two resin-made frames 26B arranged in a parallel relation are integrally molded with resin. Further, other two frames 26C made of an elastic material, e.g., rubber, are disposed in opposite sides facing the terminals 14 of the ATCU 10.

As shown in FIG. 11, projections 26Cb are formed at opposite ends of each frame 26C and are fitted to recesses formed in the resin-made frame 26B, whereby the frame 26C is properly positioned. A linear projection 26Ca is integrally formed, as shown in FIG. 10, on the upper surface of the frame 26C made of an elastic material, e.g., rubber. Also, a projection having the same shape as the projection 26Ca is integrally formed, as shown in FIG. 10, on the lower surface of the frame 26C. In lateral sides of the frame 26C, holes are formed through which the one respective ends of the bus bars 22 in the wiring unit 20 can be inserted. The dimensions of each of the holes are substantially the same as the outer dimensions of each of the bus bars 22. The one respective ends of the bus bars 22 are inserted through the holes of the frame 26C from the outer peripheral side of the frame 26C and are projected to the inner peripheral side of the frame 26C. The frame 26C may be integrally formed with the insulation molded part 24 of the wiring unit 20. Hence the sectional shape taken along the line VI-VI in FIG. 11 is similar to that in FIG. 10.

As in the embodiment shown in FIG. 10, in a state where a compressive force is applied to act on the cover 30 and the base 40 so as to compress the frame 26C having elasticity, the contact portions between the protrusion 47 of the base 40 and the hole 39 of the cover 30 are fusion-bonded to each other in the contact area 60A. Further, the contact portions between the upper surface the resin-made frame 26B and the cover 30 and the contact portions between the lower surface of the frame 26B and the base 40 are fixed to each other by fusion bonding, as shown in FIG. 5.

Thus, with a composite structure in combination of the structure shown in FIG. 3 and the structure shown in FIG. 9, the base 40, the frames 26B and 26C, and the cover 30 are held in a closely contacted state, and the ATCU 10 is contained in an enclosed space. Accordingly, even when the transmission oil enters through the gap in the fitted area between the base 40 and the cover 30, it is possible to avoid conductive materials, e.g., metal powder contained in the transmission oil, from being deposited on the terminals 14 of the ATCU 10, and to prevent the adjacent terminals 14 from being short-circuited.

As described above, since the protrusions 42 and 47 are provided on the base 40 and the contact portions between the protrusions 42, 47 and the cover 30 are fixedly bonded to each other, the short-circuiting between the adjacent bus bars 22 and the short-circuiting between the adjacent terminals 14 of the ATCU 10 can be easily prevented, thus resulting in improvement of productivity and workability.

INDUSTRIAL APPLICABILITY

According to the present invention, productivity and workability are improved in production of the control module.

The invention claimed is:

1. A control module comprising a control circuit unit and a wiring unit connecting terminals of said control circuit unit to connectors, said control circuit unit and said wiring unit being contained between a cover and a base,
    wherein said wiring unit has a resin molded part formed by resin-molding nearly central portions of bus bars, which are constituted by a plurality of conductors, the resin molded part serving as a rigid region, and a part where the bus bars are exposed serves as a flexible region;
    said base is shaped to be contacted with said cover when said cover and said base are fitted to each other, and has protrusions each formed to position between the adjacent bus bars in the flexible region; and
    contact portions between said cover and the protrusions of said base are fixedly bonded to each other.

2. The control module according to claim 1, further comprising:
    a frame arranged to surround an outer periphery of said control circuit unit and shaped to be contacted with said cover and said base when said cover and said base are fitted to each other,
    wherein one respective ends of the bus bars in said wiring unit are arranged to penetrate through said frame; and
    contact portions between said cover and said frame, contact portions between said base and said frame, or contact portions between a protrusion provided on said base to penetrate through said frame and said cover are fixedly bonded to each other.

3. The control module according to claim 2,
    wherein said frame is made of resin;
    said resin molded part and said frame are integrally molded with resin; and
    the contact portions between said cover and said frame and the contact portions between said base and said frame are fixedly bonded to each other.

4. The control module according to claim 2,
    wherein said frame is made of a material having elasticity; and
    the contact portions between the protrusion provided on said base to penetrate through said frame and said cover are fixedly bonded to each other.

5. A control module comprising a control circuit unit and a wiring unit connecting terminals of said control circuit unit to connectors, said control circuit unit and said wiring unit being contained between a cover and a base,
    wherein said control module further comprises a frame arranged to surround an outer periphery of said control circuit unit and shaped to be contacted with said cover and said base when said cover and said base are fitted to each other;
    one respective ends of the bus bars in said wiring unit are arranged to penetrate through said frame; and
    contact portions between said cover and said frame, contact portions between said base and said frame, or contact portions between a protrusion provided on said base to penetrate through said frame and said cover are fixedly bonded to each other.

* * * * *